United States Patent [19]  [11] Patent Number: 4,926,381
Fujii  [45] Date of Patent: May 15, 1990

[54] SEMICONDUCTOR MEMORY CIRCUIT WITH SENSING ARRANGEMENT FREE FROM MALFUNCTION

[75] Inventor: Takeo Fujii, Tokyo, Japan

[73] Assignee: NEC Corporation, Tokyo, Japan

[21] Appl. No.: 277,736

[22] Filed: Nov. 30, 1988

[30] Foreign Application Priority Data

Nov. 30, 1987 [JP] Japan .................. 62-303517

[51] Int. Cl.⁵ .................. G11C 7/00; G11C 11/42
[52] U.S. Cl. .................. 365/189.01; 365/210; 365/207; 365/233
[58] Field of Search ............... 365/189, 206, 207, 210, 365/203

[56] References Cited

U.S. PATENT DOCUMENTS 4,393,475  7/1983  Kitagawa et al. ............... 365/201
4,760,562  7/1988  Ohtani et al. .................. 365/277
4,777,625  10/1988  Sakui et al. ................... 365/189

Primary Examiner—Stuart N. Hecker
Assistant Examiner—Alyssa H. Bowler
Attorney, Agent, or Firm—Sughrue, Mion, Zinn, Macpeak & Seas

[57] ABSTRACT

A dynamic memory circuit which can operate at a high speed and with a reduced amount of noise is disclosed. The memory circuit includes word lines and a pair of dummy word lines arranged in rows, a plurality of bit lines pairs arranged in columns, a plurality of memory cells, dummy capacitors connected between the dummy word lines and the bit line pairs and a plurality of transfer gate pairs inserted between the bit line pairs and the sense amplifiers.

8 Claims, 6 Drawing Sheets

SEMICONDUCTOR MEMORY CIRCUIT WITH SENSING ARRANGEMENT FREE FROM MALFUNCTION

BACKGROUND OF THE INVENTION

1. Field of the Invention:

The present invention relates to a semiconductor memory circuit and, more particularly to a dynamic type random access memory circuit (DRAM) fabricated on a semiconductor substrate.

2. Description of the Related Art:

Dynamic memory circuits have been utilized in various fields as large capacity semiconductor memories. The dynamic memory circuit is typically constructed in such a manner that one-transistor type memory cells each composed of one transfer gate transistor and a capacitor are arranged in a matrix form of rows and columns with word lines arranged in rows and pairs of bit lines arranged in columns. In each memory cell, storage of information is conducted by existence or non-existence of electric charge in the capacitor. Reading of information is achieved by selecting one of the word lines so that electric charge of the memory cell connected to the selected word line is transferred to one bit line in the pair of bit lines of the same column as the selected memory cell with the other bit line set at a reference voltage. As a result, a small difference in voltage, normally 100 to 200 mV, is generated between the pair of bit lines. This small voltage difference is amplified by a sense amplifier. The amplified signal is read out via an output circuit and also is restored into the preselected memory cell for maintaining information storage.

The reference voltage is usually set at an intermediate level of logic "1" and "0" levels stored in the memory cells. Since the logic "1" and "0" levels are practically set at a power source voltage Vcc and a ground potential, respectively, the reference voltage is practically set at ½ Vcc level.

Several methods are available for providing the reference voltage. One of them is to produce the reference voltage by changing the potential of a dummy word line which is capacitively coupled to the bit lines. This method employs a memory configuration consisting of only one capacitive cell for each bit line, which is simple and suited for high-density integration. According to this method, the pair of bit lines which are amplified to the logic "1" (High) and "0" (Low) levels, respectively, during a time when an active period are short-circuited during a reset period subsequent to the active period. As a result, the pair of bit lines are precharged approximately to a ½ Vcc level. Then, in a subsequent active period, one of the dummy word lines is selectively fallen in potential to cause slight fall in potential at one bit line of the bit line pair with the other bit line to which a read signal from the selected memory cell is applied. More particularly, in the ½ Vcc precharging method, since the precharge potential at the bit lines is the intermediate potential between the bit line potential when stored information in the memory cell is high and the bit line potential when it is low, the precharge potential can theoretically be deemed as a reference potential and can be fed as it is to the sense amplifier. In reality, however, for many reasons, it is often desired that the reference potential be slightly lower than the bit line precharge potential (½ Vcc). Therefore, the dummy word line is made to have a capacitive element to provide a desired reference potential on the bit line. After this, the sense amplifier is activated and the differential voltage between the pair of bit lines with a result of, for example, one bit line at the power supply potential and the other bit line at the ground potential. At this time, the charge in the memory cell capacitor is recovered to the state before the readout operation, that is the memory cell capacitor becomes refreshed.

However, according to the above conventional method employing the dummy word line, there is a problem that, since a capacitive coupling is provided between the dummy word lines and the bit lines, which is identical to providing a capacitive coupling between the bit lines through the dummy word lines, the capacitive coupling forms a path for supplying changes in other bit line pairs as noises when the sense amplifier operates.

Generally, the sense amplifier's amplification or decision speeds for the high level and low level states of the memory cells are not equal because of memory layout and manufacturing factors. Further, the input differential voltage to the sense amplifier when the memory cell is high is not always equal to that when the memory cell is low. Suppose, as in the previous explanation, when the word line is selected, only one selected memory cell connected to one bit line pair is low with the remaining selected memory cells connected to other bit line pairs at a high level. In this case, the decision speed of the sense amplifier for that one selected memory cell at the low level is slow, so that the potential differences of other bit line pairs are amplified by the sense amplifiers before the potential difference of the one bit line pair becomes sufficiently large.

Thus, one stored state of the minority number of the selected memory cells affects the other state of the minority number of the selected memory cell or cells through the dummy word line and their associated capacitive elements. As a result, the operation speed of the memory circuit is lowered and effective sensitivity of the sense amplifiers is also lowered.

These problems will grow in severity as the memory capacity increases, i.e., as the number of pairs of bit lines sharing the dummy word lines and the wiring resistance of the dummy word lines increase.

SUMMARY OF THE INVENTION

It is an object of the present invention to provide a semiconductor memory circuit which can operate at a high speed.

It is another object of the present invention to provide a dynamic semiconductor memory having an improved memory arrangement free from noise generated from other memory cell operations.

A semiconductor memory circuit according to the present invention comprises word lines and a pair of dummy word lines arranged in rows, a plurality of pairs of bit lines arranged in columns, a plurality of sense amplifiers having a pair of sense nodes coupled to each of the pairs of bit lines, a plurality of memory cells connected to the word lines and the bit lines a plurality of dummy capacitors connected between the dummy word lines and the bit lines, and a plurality of pairs of transfer gates connected between the pairs of sense nodes and the pairs of bit lines, respectively.

The pairs of transfer gates are made non-conductive when the sense amplifiers start to amplify the signal difference between each pair of sense nodes. Therefore, potential change in the pair of sense nodes of one sense amplifier is not transmitted to the pair of sense nodes of the other sense amplifier via the dummy capacitors and the dummy word lines.

BRIEF DESCRIPTION OF THE DRAWINGS

The above and further objects, features and advantages of the present invention will become more apparent from the following detailed description taken in conjunction with the accompanying drawings, wherein.

DETAILED DESCRIPTION OF THE INVENTION

Figure 1:
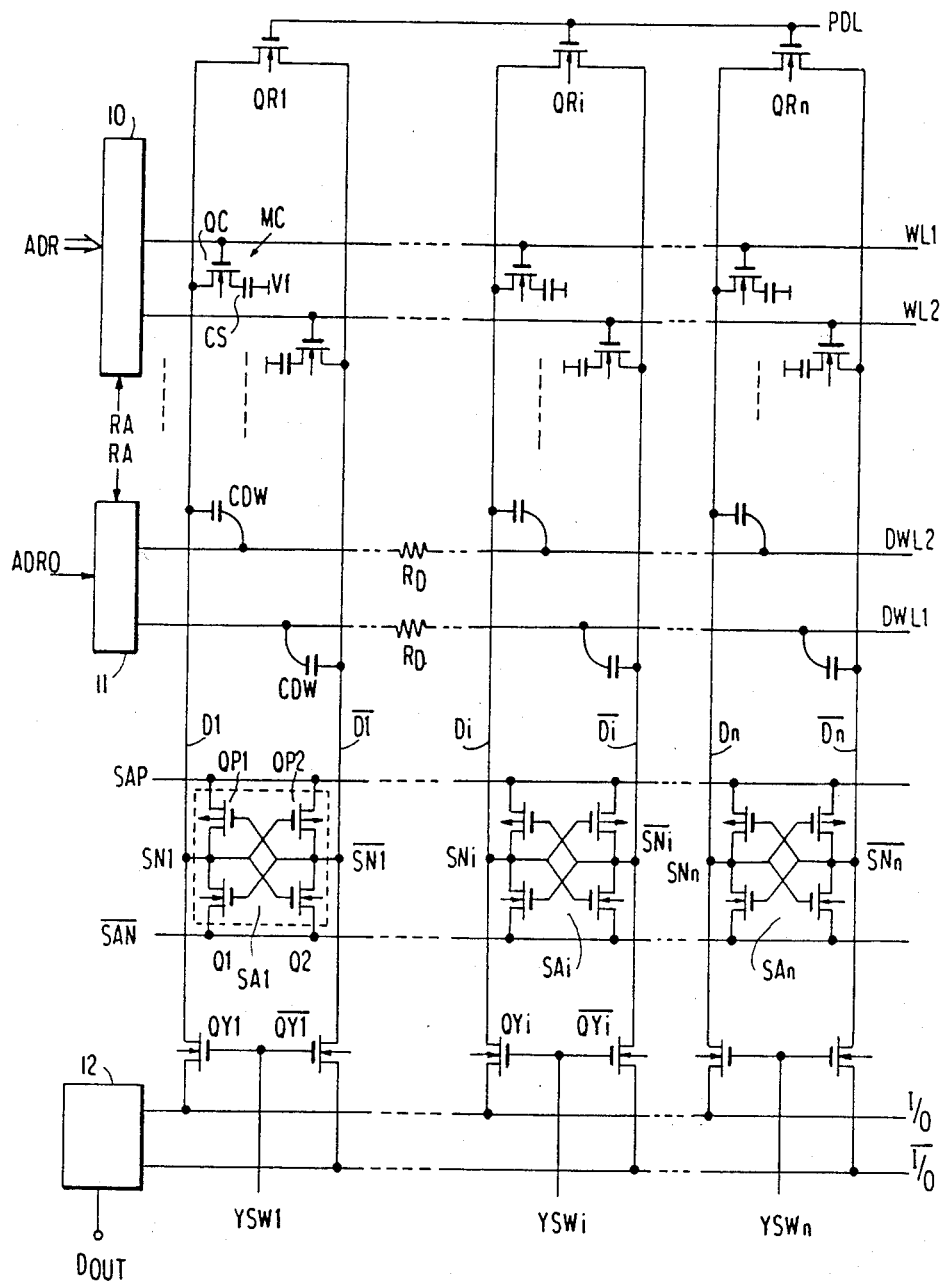
FIG. 1 is a schematic block diagram showing a semiconductor memory circuit in the prior art
Figure 2:
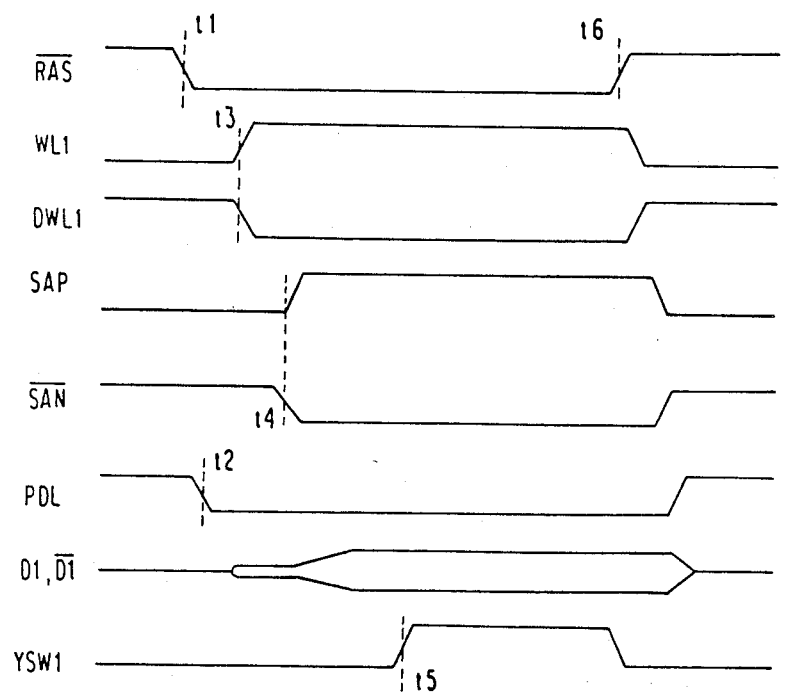
FIG. 2 is a timing diagram showing an operation of the memory circuit of FIG. 1.

Prior Art:

With reference to FIGS. 1 and 2, a typical structure of the conventional dynamic memory will be explained.

As shown in FIG. 1, the memory comprises a plurality of dynamic memory cells MC each having a memory cell transistor $Q_c$ and a storage capacitor CS connected between the transistor Qs and a fixed potential $V_f$, word lines $WL_1$, $WL_2$ —arranged in rows, dummy word lines $DWL_1$, $DWL_2$ arranged in rows, a plurality of bit line pairs $D_1$, $\overline{D_1}$-$D_n$, $\overline{D_n}$ arranged in columns, CMOS type sense amplifiers SA1 - SAN provided for the bit line pairs $D_1$, $\overline{D_1}$-$D_n$, $\overline{D_n}$, respectively, a pair of common data lines I/O, $\overline{I/O}$, a plurality of pairs of column selection transistors $QY_1$, $\overline{QY_1}$-$QY_n$, $\overline{QY_n}$, a row decoder 10 for operatively selecting one of the word lines, a dummy decoder 11 for selecting one of the dummy word lines, and an output circuit 12.

The row decoder 10 receives row address signals ADR and operatively selects one of the word lines in response to a control signal RA which is generated from an external control signal $\overline{RAS}$. The dummy decoder 11 receives one bit of row address signal ADR0 to operatively select one of the dummy word lines $DWL_1$, $DWL_2$. A plurality of dummy capacitors CDW are connected between the dummy word line $DWL_2$ and the bit lines $D_1$-$D_n$ and between the dummy word line $DWL_1$ and the bit lines $\overline{D_1}$-$\overline{D_n}$, respectively. Each of the sense amplifiers $SA_1$-$SA_n$ includes P-channel MOS transistors QP1, QP2 and N-channel MOS transistors $Q_1$, $Q_2$, and is connected to a first activation line SAP and a second activation line $\overline{SAN}$. The pairs of column selection transistors $\overline{QY_1}$-$QY_n$, $\overline{QY_n}$ are controlled by column decoder signals $YSW_1$-$YSW_n$ in a known way. Bit line reset transistors $QR_1$-$QR_n$ are connected between the pairs of bit lines respectively and operatively short-circuit therebetween in response to a reset control signal thereby to set the pairs of bit lines approximately at an intermediate level (½ Vcc) of a power voltage (Vcc).

An operation of the memory of FIG. 1 will be explained with reference to FIG. 2.

The external control signal (a row address strobe signal) $\overline{RAS}$ becomes an active (low) level at a time point $t_1$ to set the memory in an active state. Then, the reset control signal PDL changes to an inactive level (low level) to make the transistors $QR_1$-$QR_n$ non-conductive at a time point $t_2$, so that the pairs of bit lines are set at the intermediate level (½ Vcc) under a high impedance state. Then, at a time point $t_3$, the row decoder 10 and the dummy decoder 11 are enabled in response to activation of the control signal RA so that one of word lines, e.g. $WL_1$ and one of the dummy word lines, e.g. $DWL_1$ are selected. As a result, electric charge of the memory cell coupled to the selected word line $WL_1$ is transferred to one of the pair of bit line D1 to cause a small change (e.g. 200 mV) in potential therein while the other bit line $\overline{D1}$ is subjected to a small fall in potential through the dummy capacitor CDW coupled to the selected dummy word line $DWL_1$.

In the ½ Vcc precharging method, since the precharge potential of the bit lines is the intermediate potential between the bit line potential when stored information of the memory cell is high and the bit line potential when it is low, the precharge potential can theoretically be deemed as a reference potential and be fed to the sense amplifier. In reality, however, it is often desired for many reasons that the reference potential be slightly lower than the bit line precharge potential. One of the above reasons is that the "1" or high level information stored in the memory cell is gradually lost due to a leak path through the capacitor $C_S$. Therefore, in order to comparatively compensate the leak of the "1" level information, the other bit line not connected to the selected memory cell is slightly lowered in potential via the dummy word line and the dummy capacitor CDW. Therefore, the dummy word line DWL1 is made to go low to set the bit line at a desired reference potential. After this, the sense amplifier activating signals $\overline{SAN}$ and SAP are caused to go low and high respectively at a time point $t_4$. This enables the sense amplifiers so that differential voltage between the pair of bit lines $D_1$, $\overline{D_1}$, is amplified into, for example, the bit line $D_1$ at the power supply potential Vcc and the bit line $\overline{D_1}$ at the ground potential. At this time, the charge in the memory cell capacitor Cs returns to the state before the readout operation, i.e., the memory cell capacitor becomes refreshed. After this, a column address strobe $\overline{CAS}$ (not shown) becomes active so that in response to column address signals (not shown), one of the column decoder signals e.g. YSW1 becomes high at a time point $t_5$, transferring the signals of the pair of bit lines $D_1$, $\overline{D_1}$ to the common data lines I/O, $\overline{I/O}$. At a time point $t_6$, as the row address strobe RAS becomes inactive. Therefore, the column selection signal YSW1 becomes inactive and the word line $WL_1$ becomes low . Meanwhile, the signal PDL goes high to make the transistors $QR_1$-$QR_n$ conductive. As a result, the signals $\overline{SAN}$ and SAP are shorted to reset the sense amplifier, as well as precharging the bit lines to the almost intermediate potential (½ Vcc).

The problem of the conventional dummy word method employing the dummy word lines is that since a capacitive coupling is provided between the dummy word lines and the bit lines, which is identical to providing a capacitive coupling between the bit lines through the dummy word lines and the dummy capacitors, the capacitive coupling forms a path for noise when the sense amplifier operates.

Generally, the sense amplifier's amplification speeds for the high level and low level states of the memory cells are not equal because of memory layout and manufacturing factors. Further, the input differential voltage to the sense amplifier when the memory cell is high is not always equal to that when the memory cell is low. Suppose, as in the previous explanation, when the word line WL1 is selected, only the memory cell connected to the bit line $\overline{D_1}$ is low with the remaining memory cells at high level. In this case the amplification speed of the sense amplifier SA1 for that memory cell at low level is slow, so that the potential differences amplified by the sense amplifiers SA2-SA$_n$ before the potential difference of the pair of bit lines $D_1$, $\overline{D_1}$ becomes sufficiently large. This causes the pair of electrodes of the dummy capacitors CDW connected to the dummy word line DWL1 except for those connected to the bit line D1 to rapidly go low, which in turn causes the dummy word line DWL$_1$ to go low due to capacitive coupling. As a result, the potential of the bit line $D_1$, whose differential voltage is not yet amplified sufficiently and which would otherwise increase, will be pulled down by noise. Conversely, the dummy word line DWL$_2$ goes high, raising the potential of the bit line $\overline{D_1}$, producing noise. These noise voltages lead to erroneous operation of the sense amplifier, which will result in such problems as a reduction in the yield in memory production and an increase in the inspection and measuring time because of the operation margin's data pattern dependence.

These problems will grow in severity as the memory capacity increases, i.e., as the number of pairs of bit lines sharing the dummy word lines and the wired resistance R$_D$ of the dummy word lines increase.

Figure 3:
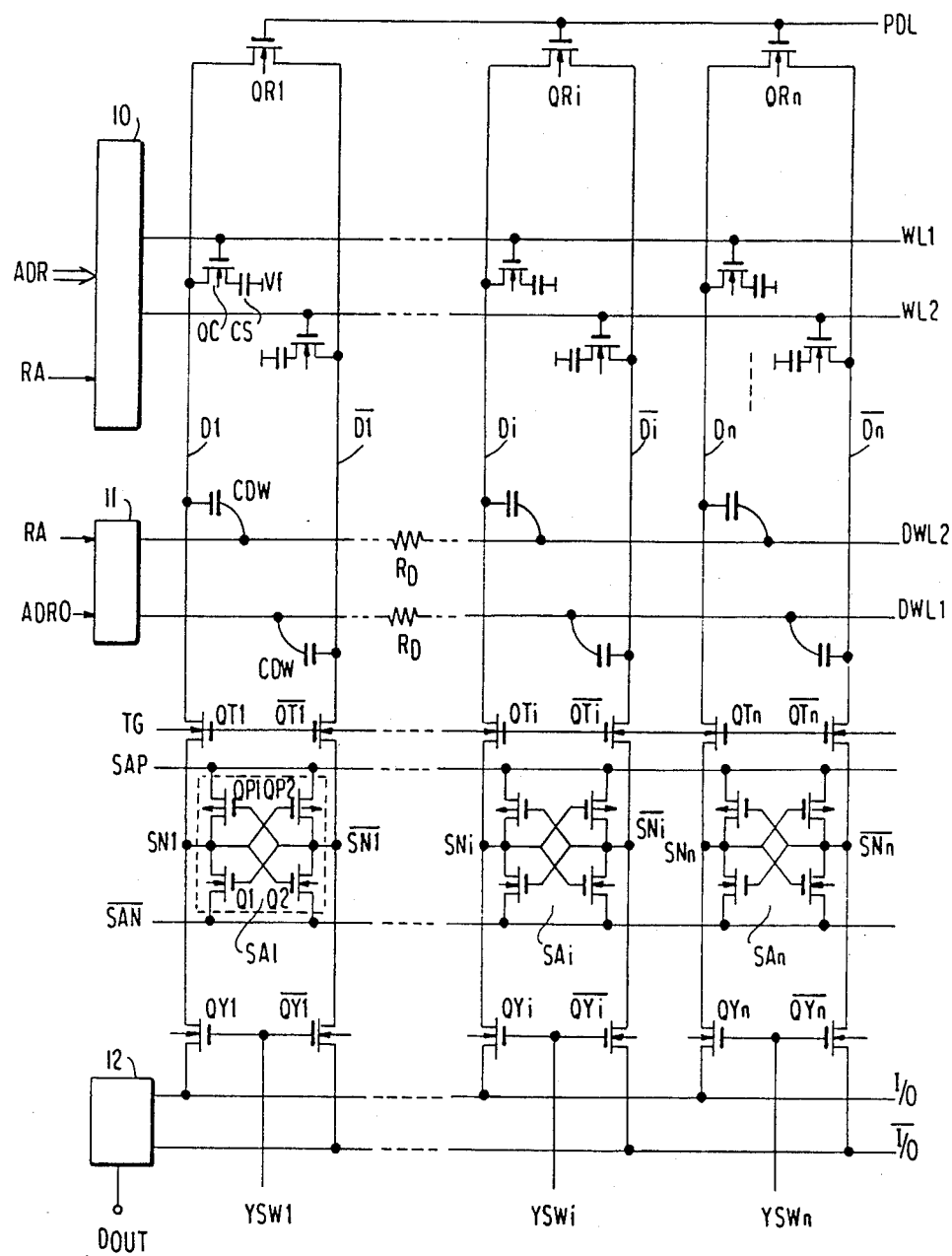
FIG. 3 is a schematic block diagram showing a semiconductor memory according to one embodiment of the present invention.
Figure 4:
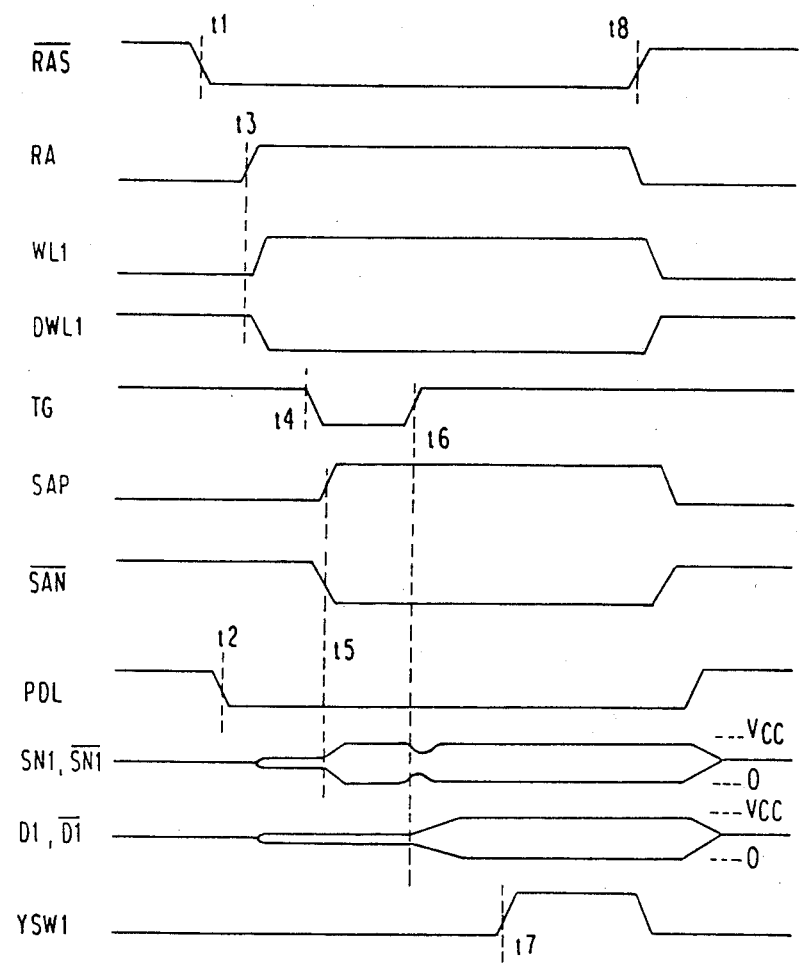
FIG. 4 is a timing diagram of one example of operation of the memory of FIG. 3.
Figure 5:
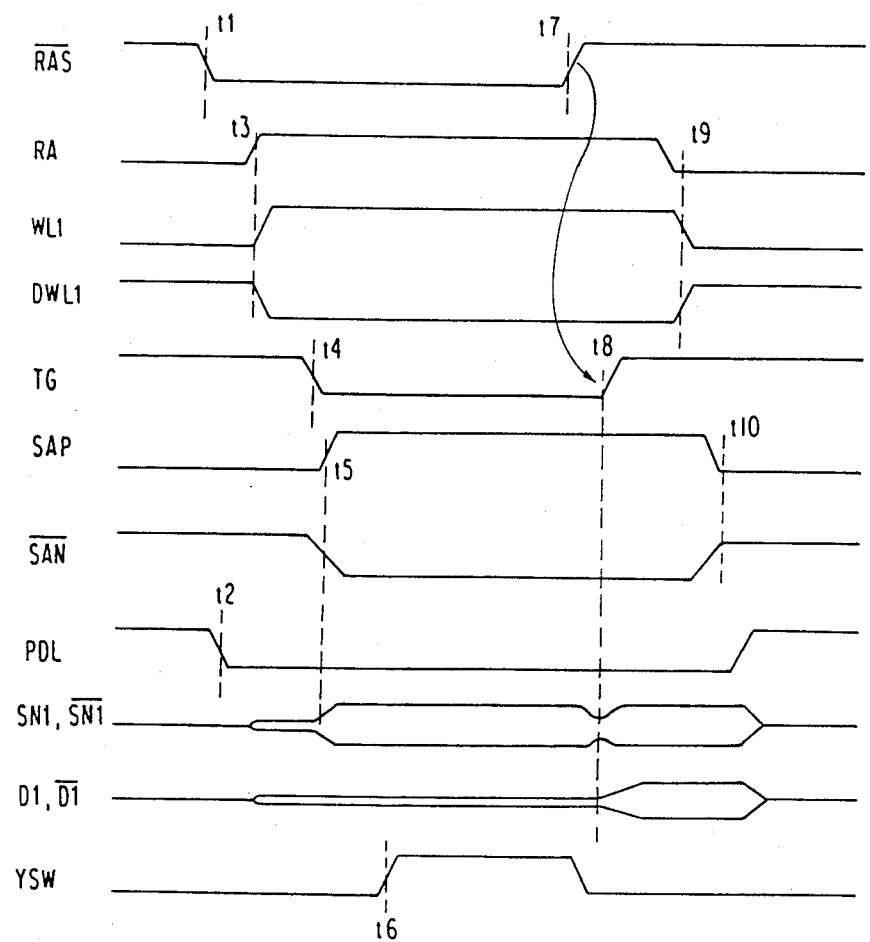
FIG. 5 is a timing diagram showing another example of operation of the memory of FIG. 3.

Preferred Embodiments:

With reference to FIGS. 3 to 5, a semiconductor memory according to one embodiment of the present invention will be explained.

In FIG. 3, the elements or parts that performs the same operations as those in FIG. 1 are designated by like reference number or symbols.

As will be seen in FIG. 3, the memory according to this embodiment is featured in that the pairs of bit lines $D_1$, $\overline{D_1}$-$D_n$, $\overline{D_n}$ are physically isolated from pairs of sense nodes SN$_1$, $\overline{SN_1}$-SN$_n$, $\overline{SN_n}$ of the sense amplifiers SA$_1$-SA$_n$ and pairs of transfer gate transistors QT$_1$, $\overline{QT_1}$-QT$_n$, $\overline{QT_n}$ are inserted between the pairs of bit lines and the pairs of sense nodes, respectively. The transfer gate transistors QT$_1$, $\overline{QT_1}$-QT$_n$, $\overline{QT_n}$ are controlled by a transfer gate control signal TG in common.

The dummy word lines DWL$_1$ and DWL$_2$ have resistance R$_D$ distributed in their length and the capacitance of the dummy capacitors CDW is selected within a range of $\frac{1}{2}$ to 1/5 of the storage capacitor Cs.

An example of operation of the memory of FIG. 3 will be explained with reference to FIG. 4.

The row address strobe $\overline{RAS}$ as the external control signal becomes active (low level) at a time point t$_1$ and the reset control signal PDL becomes inactive (low) at t$_2$. In response to the activation of $\overline{RAS}$, the control signal RA becomes active (high level) at t$_3$ to enable the decoders 10 and 11 thereby to select one of the word lines, e.g. WL$_1$ and one of the dummy word lines, e.g. DWL1. As a result, a small potential difference is produced between the pair of bit lines $D_1$, $\overline{D_1}$ and the sense nodes SN$_1$, $\overline{SN_1}$. Then, at t$_4$, the control signal TG is lowered to make the transfer gate transistors QT$_1$, $\overline{QT_1}$-QT$_n$, $\overline{QT_n}$ non-conductive at t$_4$. Thereafter, the signal $\overline{SAN}$ is lowered and the signal SAP is raised at t$_5$ to enable the sense amplifiers SA$_1$-SA$_n$. As a result, the signal difference between the pair of sense nodes SN$_1$, $\overline{SN_1}$ is amplified at a high speed.

Then, at t$_6$, the transfer gate control signal TG is raised to render the transfer gate transistors QT$_1$, $\overline{QT_1}$-QT$_n$, $\overline{QT_n}$ conductive so that the small signal difference between the pair of bit lines $D_1$, $\overline{D_1}$ is amplified by the sense amplifier SA1. As a result, the bit line D$_1$ and the sense node SN$_1$ assume the supply potential Vcc while the bit line $\overline{D_1}$ and the sense node $\overline{SN_1}$ take the ground potential. At this time the charge in the memory cell capacitor Cs returns to the state before readout operation, i.e., the memory cell capacitor is refreshed. The succeeding operation is the same as that of the conventional memory.

The object of the transfer gate transistors QT$_1$, $\overline{QT_1}$-QT$_n$, $\overline{QT_n}$ is to cut off or alleviate noise voltage through the dummy word lines and the dummy capacitors when the sense amplifiers are activated.

Namely, when the sense amplifiers SA1-SAn are enabled to amplify the signal difference between the respective pairs of sense nodes, the dummy word lines and the dummy capacitors are electrically isolated from the pairs of sense nodes. Thus, mutual affection between the sense amplifiers through the dummy word lines can be effectively prevented. The pairs of bit lines are electrically connected to the sense amplifiers after the states of the sense amplifiers are established. Therefore, the potential difference between each pair of bit lines is stably amplified by the established state of the sense amplifier at a high speed.

The control of the transfer gate control signal TG is not limited to that of the embodiment. For example, the transfer gate control signal TG may not be dropped to the ground potential but instead may be kept at the intermediate level ($\frac{1}{2}$ Vcc). This method will also produce a desired result.

With reference to FIG. 5, another example of operation of the memory of FIG. 3 will be explained.

The sequence of operation from t$_1$-t$_5$ in FIG. 5 is the same as that from t$_1$-t$_5$ in FIG. 4, i.e. until the activation of the sense amplifiers. The difference from the example of FIG. 4 lies in the fact that before the transfer gate control signal TG goes high, the column decoder signal YSW1 is made to go high to connect the sense nodes SN$_1$, $\overline{SN_1}$ to the common data lines I/O, $\overline{I/O}$. At this time, the bit lines $D_1$, $\overline{D_1}$ are not connected to the nodes SN$_1$, $\overline{SN_1}$, remaining uncharged or undischarged. After the row address strobe $\overline{RAS}$ goes high at t$_7$, the transfer gate control signal TG is made to go high at t$_8$, starting to amplify the bit lines $D_1$, $\overline{D_1}$ to refresh the memory cell. After this, the word line WL$_1$ is made to go low at t$_9$ and the signal PDL is made to go high, shorting the pair of bit lines as well as $\overline{SAN}$, SAP to reset the sense amplifier and thus finish the active operation. Performing the control in this way makes it possible to cut off the noise voltage from the dummy word line and provide a high-speed sense amplifier.

Figure 6:
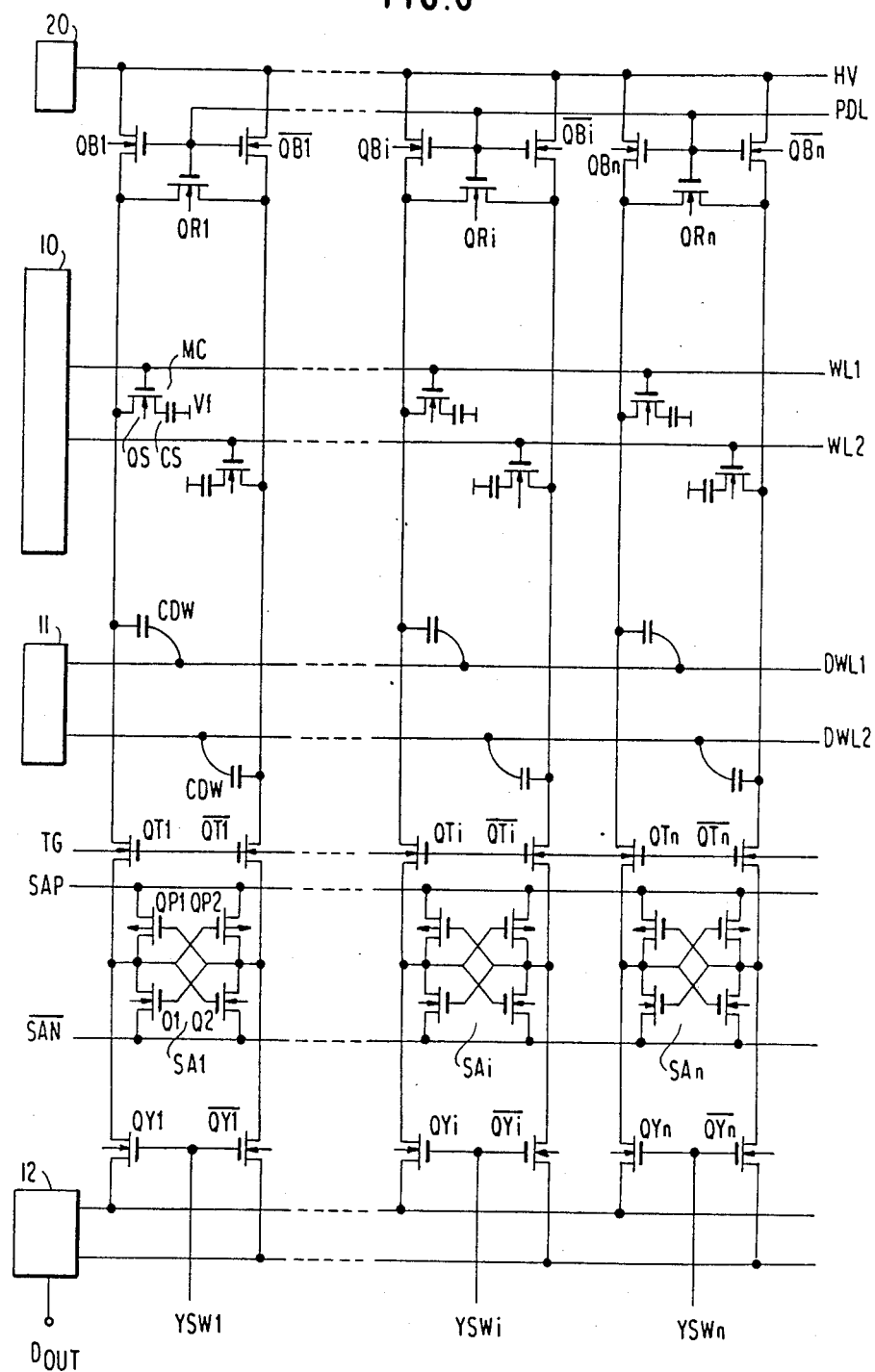
FIG. 6 is a schematic block diagram showing a semiconductor memory according to another embodiment of the present invention.

With reference to FIG. 6, a semiconductor memory according to another embodiment will be explained.

The memory of FIG. 6 is featured in that a reference voltage generator 20 generating a reference potential HV of approximately $\frac{1}{2}$ Vcc and a plurality of pairs of charge transistors QB$_1$, $\overline{QB_1}$-QB$_n$, $\overline{QB_n}$ are connected between the reference potential HV and the pairs of bit lines $D_1$, $\overline{D_1}$-$D_n$, $\overline{D_n}$, respectively. The transistors QB$_1$, $\overline{QB_1}$-QB$_n$, $\overline{QB_n}$ are rendered conductive in response to the active (high) level of TG to maintain the precharge level of approximately ½ Vcc at the bit lines throughout the reset, precharge period. Therefore, according to the present embodiment, reduction due to leakage in the precharge potential generated by short-circuiting the pairs of bit lines by $QR_1$-$QR_n$ can be avoided.

With the present invention, as explained above, after a desired reference voltage is generated, the capacitive-coupling type dummy word is separated from the sense nodes to cut off noise transmitted through the capacitive element making up the dummy word. This eliminates problems caused by noise such as a reduction in the yield in memory manufacture and an increase in time for measurement.

I claim:

1. A semiconductor memory circuit comprising:
   a plurality of first and second word lines arranged in rows;
   a plurality of bit line pairs intersecting with said word lines, each of said bit line pairs having first and second bit lines arranged in columns so as to define a plurality of first bit lines and a plurality of second bit lines;
   a plurality of first memory cells coupled to said first word lines and said first bit lines;
   a plurality of second memory cells coupled to said second word lines and said second bit lines;
   first and second dummy word lines arranged in rows;
   a plurality of first dummy capacitors directly connected between said first bit lines and said first dummy word line;
   a plurality of second dummy capacitors directly connected between said second bit lines and said second dummy word line, said first bit lines being capacitively coupled to each other through said first dummy capacitors and said first dummy word line, said second bit lines being capacitively coupled to each other through said second dummy capacitors and said second dummy word line;
   a row decoder for selecting one of said first and second word lines;
   a dummy row decoder for selecting said first dummy word line to adjust a potential of said first digit lines when one of said second word lines is selected by said row decoder, and for selecting said second dummy word line to adjust a potential of said second digit lines when one of said first word lines is selected by said row decoder;
   a plurality of sense amplifiers provided for said bit line pairs, each of said sense amplifiers having first and second sense nodes and operatively amplifying a signal difference between said first and second sense nodes when enabled;
   a plurality of transfer gate pairs connected between said bit line pairs and said sense amplifiers, each of said transfer gate pairs having first and second transfer gates connected between the first and second digit lines of one of said bit line pairs and the first and second sense nodes of one of said sense amplifiers, respectively;
   first means coupled to said row decoder and said dummy decoder for enabling said row decoder and said dummy row decoder during a first period, said first period having a first sub-period, a second sub-period following said first sub-period and a third sub-period following said second sub-period;
   second means for enabling said transfer gate pairs during said first and third sub-periods and disenabling said transfer gate pairs during said second sub-period; and
   third means for enabling said sense amplifiers during said second and third sub-periods and disenabling said sense amplifiers during said first sub-period.

2. The memory circuit according to claim 1, further comprising a plurality of reset transistors provided for said plurality of bit line pairs, each of said reset transistors having a drain-source current path connected between the first and second bit lines of each of said bit line pairs and means for rendering said reset transistors before said first period.

3. The memory circuit according to claim 1, in which each of said sense amplifiers includes a CMOS type flip-flop circuit.

4. A semiconductor memory circuit comprising:
   a plurality of first word lines arranged in rows;
   a plurality of second word lines arranged in rows;
   a plurality of bit line pairs intersecting with said first and second word lines and arranged in columns normal to said rows, each of said bit line pairs having first and second first lines arranged in parallel;
   a plurality of first memory cells coupled to said first word lines and said first bit lines;
   a plurality of second memory cells coupled to said second word lines and said second bit lines;
   first and second dummy word lines arranged in rows, each of said first and second dummy word lines having a resistance in its longitudinal direction;
   a plurality of first capacitors each connected directly between one of said first bit lines and said first dummy word line;
   a plurality of second capacitors each connected between one of said second bit lines and said second dummy word line;
   a plurality of sense amplifiers respectively provided for each of said bit line pairs, each of said sense amplifiers having first and second sense nodes;
   a plurality of first transfer gates connected between said first bit lines and said first sense nodes of said sense amplifiers, respectively;
   a plurality of second transfer gates connected between said second bit lines and said second sense nodes of said sense amplifiers, respectively;
   a row decoder for selecting one of said first and second word lines during an addressing period;
   a dummy row decoder for selecting one of said first and second dummy word lines during said addressing period, said dummy row decoder selecting said second dummy word line when said row decoder selects one of said first word lines and selecting said first dummy word line when said row decoder selects one of said second word lines;
   first means for enabling said sense amplifiers to amplify signals between the first and second sense nodes thereof during sequential first and second periods within said addressing period; and
   second means for simultaneously controlling said first and second transfer gates, said second means rendering said first and second transfer gates non-conductive during said first period and conductive during said second period and a third period before said first period within said addressing period.

5. The memory circuit according to claim 4, further comprising first and second bus lines and a plurality of column selection circuits for selectively connecting the first and second sense nodes of one of said sense amplifiers to said first and second bus lines.

6. The memory circuit according to claim 4, further comprising a plurality of reset transistors provided for said plurality of digit line pairs, each of said reset transistors operatively short-circuiting the first and second bit lines of one of said bit line pairs after said addressing period.

7. The memory circuit according to claim 4, in which each of said sense amplifiers includes a CMOS flip-flop circuit.

8. The memory circuit according to claim 4, in which said first and second word lines are alternately arranged one by one.

* * * * *

UNITED STATES PATENT AND TRADEMARK OFFICE
CERTIFICATE OF CORRECTION

PATENT NO. : 4,926,381

DATED : May 15, 1990

INVENTOR(S) : Fujii

It is certified that error appears in the above-identified patent and that said Letters Patent is hereby corrected as shown below:

Col. 3, line 58, delete "SAN" and insert --$\overline{SAN}$--.

Col. 3, line 59, after "transistors" insert --$QY_1$,--.

Col. 4, line 53, delete "RAS" and insert --$\overline{RAS}$--.

Col. 5, line 17, delete "DWL1" and insert --$DWL_1$--.

Col. 5, line 63, delete "DWL1" and insert --$DWL_1$--.

Col. 6, line 20, delete "SA1-SAn" and insert --$SA_1$-$SA_n$--.

Signed and Sealed this

Third Day of September, 1991

Attest:

HARRY F. MANBECK, JR.

*Attesting Officer*   Commissioner of Patents and Trademarks